(12) United States Patent
Zeng

(10) Patent No.: US 10,665,720 B2
(45) Date of Patent: May 26, 2020

(54) PIXEL STRUCTURE, ARRAY SUBSTRATE, LIQUID CRYSTAL DISPLAY PANEL AND PIXEL STRUCTURE MANUFACTURE METHOD

(71) Applicant: Shenzhen China Star Optoelectronics Technology Co., Ltd., Shenzhen, Guangdong (CN)

(72) Inventor: Mian Zeng, Guangdong (CN)

(73) Assignee: SHENZHEN CHINA STAR OPTOELECTRONICS TECHNOLOGY CO., LTD., Shenzhen, Guangdong (CN)

(*) Notice: Subject to any disclaimer, the term of this patent is extended or adjusted under 35 U.S.C. 154(b) by 61 days.

(21) Appl. No.: 15/034,175

(22) PCT Filed: Dec. 31, 2015

(86) PCT No.: PCT/CN2015/100281
§ 371 (c)(1),
(2) Date: May 3, 2016

(87) PCT Pub. No.: WO2017/088272
PCT Pub. Date: Jun. 1, 2017

(65) Prior Publication Data
US 2018/0097099 A1    Apr. 5, 2018

(30) Foreign Application Priority Data
Nov. 27, 2015  (CN) .......................... 2015 1 0846601

(51) Int. Cl.
| | | |
|---|---|---|
| *H01L 29/786* | (2006.01) | |
| *H01L 51/10* | (2006.01) | |
| *H01L 27/32* | (2006.01) | |
| *H01L 29/417* | (2006.01) | |
| *H01L 51/05* | (2006.01) | |
| *G02F 1/1368* | (2006.01) | |
| *G02F 1/1362* | (2006.01) | |
| *H01L 29/423* | (2006.01) | |

(52) U.S. Cl.
CPC ........ *H01L 29/786* (2013.01); *G02F 1/13624* (2013.01); *G02F 1/136227* (2013.01);
(Continued)

(58) Field of Classification Search
CPC . H01L 29/786; H01L 29/423; H01L 51/0545; H01L 27/3248; H01L 51/105;
(Continued)

(56) References Cited

U.S. PATENT DOCUMENTS 6,100,954 A * 8/2000 Kim .................. G02F 1/133345
257/410
6,261,880 B1  7/2001 Wu
(Continued)

FOREIGN PATENT DOCUMENTS

CN    101088166 A    12/2007
CN    101093325 A    12/2007
(Continued)

*Primary Examiner* — Hoang-Quan Ho
(74) *Attorney, Agent, or Firm* — Leong C. Lei

(57) ABSTRACT

The present invention provides a pixel structure, an array substrate, a liquid crystal display panel and a pixel structure manufacture method. The pixel structure includes a pixel electrode layer and a thin film transistor. The thin film transistor includes a gate, a source and a drain which are isolated with the gate and an organic semiconductor layer. The pixel structure further includes an Indium Tin Oxide layer and a metal layer, and the metal layer is located on a portion of the ITO layer. The source, the drain are formed on the ITO layer. A pattern formed by the organic semiconductor layer is electrically coupled to the ITO layer and the metal layer, and the pixel electrode layer is electrically coupled to the metal layer and the ITO layer.

3 Claims, 4 Drawing Sheets

(52) U.S. Cl.
CPC ...... *H01L 27/3248* (2013.01); *H01L 27/3279* (2013.01); *H01L 29/417* (2013.01); *H01L 29/423* (2013.01); *H01L 51/0545* (2013.01); *H01L 51/102* (2013.01); *H01L 51/105* (2013.01); *G02F 1/1368* (2013.01); *H01L 51/0541* (2013.01); *H01L 2251/308* (2013.01)

(58) Field of Classification Search
CPC ............... H01L 27/3279; H01L 29/417; G02F 1/13624; G02F 1/1368; G02F 1/136227
See application file for complete search history.

(56) References Cited

U.S. PATENT DOCUMENTS

| | | | | |
|---|---|---|---|---|
| 6,433,357 | B1* | 8/2002 | Kuijk | G02F 1/1368 |
| | | | | 257/40 |
| 2007/0290229 | A1* | 12/2007 | Choi | G02F 1/13624 |
| | | | | 257/192 |
| 2008/0157068 | A1 | 7/2008 | Lee | |
| 2009/0026444 | A1* | 1/2009 | Choi | H01L 27/283 |
| | | | | 257/40 |
| 2011/0291122 | A1 | 12/2011 | Shin | |
| 2014/0038371 | A1 | 2/2014 | Chaoyong | |
| 2014/0054568 | A1* | 2/2014 | Ishii | H01L 51/105 |
| | | | | 257/40 |
| 2017/0025493 | A1* | 1/2017 | Xu | H01L 27/3274 |
| 2017/0288029 | A1* | 10/2017 | Amari | H01L 27/1225 |

FOREIGN PATENT DOCUMENTS

| | | |
|---|---|---|
| CN | 101128939 A | 2/2008 |
| CN | 103383924 A | 11/2013 |

\* cited by examiner

PIXEL STRUCTURE, ARRAY SUBSTRATE, LIQUID CRYSTAL DISPLAY PANEL AND PIXEL STRUCTURE MANUFACTURE METHOD

CROSS REFERENCE

This application claims the priority of Chinese Patent Application No. 201510846601.9, entitled "Pixel structure, array substrate, liquid crystal display panel and pixel structure manufacture method", filed on Nov. 27, 2015, the disclosure of which is incorporated herein by reference in its entirety.

FIELD OF THE INVENTION

The present invention relates to a display technology field, and more particularly to a pixel structure, an array substrate, a liquid crystal display panel and a pixel structure manufacture method.

BACKGROUND OF THE INVENTION

The active matrix flat panel display, such as the liquid crystal display utilizes the Thin Film Transistor (TFT) elements to be the driving elements. Generally, the inorganic semiconductor material has higher mobility, and thus has been widely employed to be the semiconductor layer material of the thin film transistor. In comparison with the inorganic semiconductor material, the organic semiconductor material has lower mobility but possesses being light and thin, flexible and the adaptability of low temperature manufacture process. Therefore, the organic semiconductor material has been used for experiment to manufacture the thin film transistor elements in the industry, recently.

At present, most of the organic semiconductor material is the P type material. For making the better ohm contact of the metal and the organic semiconductor material, the material with larger work function, such as gold (Au), silver (Au), aluminum (Al), Indium Tin Oxide (ITO) is selected to be the material of the source, drain electrodes to reduce the Schottky barrier of interface of the metal and the semiconductor. It is more beneficial for the injection of the carriers, and thus is effectively to reduce the contact resistance. The usage cost of Au is higher. Therefore, the practical application is less. The metals, such as Ag, Al is easily oxidized and corroded by the following processes, such as the influence of the plasma etching, and accordingly, the connection with the pixel electrode is influenced. The ITO is commonly employed to be the transparent pixel electrode material and has excellent electrical properties, and the work function is higher, and is hardly to be oxidized. Thus, it has been widely applied for being the anode material of the organic light emitting diode (OLED). However, the resistance is larger, therefore it has restriction in the development and application of the organic thin film transistor elements and the array substrate thereof.

SUMMARY OF THE INVENTION

The present invention provides a pixel structure, an array substrate, a liquid crystal display panel and a pixel structure manufacture method to reduce the resistance of the data conducting line in the liquid crystal display panel.

The pixel structure provided by the embodiment of the present invention includes a pixel electrode layer and a thin film transistor. The thin film transistor includes a gate, a source and a drain which are isolated with the gate and an organic semiconductor layer. The pixel structure further comprises an Indium Tin Oxide layer and a metal layer, and the metal layer is located on a portion of the Indium Tin Oxide layer. The source, the drain are formed on the Indium Tin Oxide layer. A pattern formed by the organic semiconductor layer is electrically coupled to the Indium Tin Oxide layer and the metal layer.

The pixel electrode layer is electrically coupled to the metal layer and the Indium Tin Oxide layer.

The metal layer comprises a first metal sub layer and a second metal sub layer located on the first metal sub layer.

The embodiment of the present invention further provides an array substrate, comprising a plurality of the aforesaid pixel structures.

The embodiment of the present invention further provides a liquid crystal display panel, comprising the aforesaid array substrate.

The embodiment of the present invention further provides a pixel structure manufacture method, comprising:

providing a substrate;

sequentially forming an Indium Tin Oxide layer and a metal layer on one surface of the substrate;

coating a photoresist on the metal layer, and implementing exposure, development with a mask to remove all the photoresist in positions corresponding to full light transmission regions of the substrate and the mask, and preserving the photoresist in positions corresponding to full light shield regions of the substrate and the mask, and removing a portion of the photoresist in positions corresponding to halftone regions of the substrate and the mask;

etching the metal layer and the Indium Tin Oxide layer in the positions corresponding to the full light transmission regions of the substrate and the mask by wet etching;

implementing plasma surface treatment to process the substrate to remove the residual photoresist in the positions corresponding to the halftone regions of the substrate and the mask, and removing the portion of the photoresist in the positions corresponding to the full light shield regions of the substrate and the mask;

wet etching the metal layer in the positions corresponding to the halftone regions of the substrate and the mask, and preserving the Indium Tin Oxide layer in the positions corresponding to the full light shield regions, the halftone regions of the substrate and the mask for forming a source, a drain of a thin film transistor on the Indium Tin Oxide layer;

removing the residual photoresist in the positions corresponding to the full light shield regions of the substrate and the mask;

forming an organic semiconductor layer on the substrate and manufacturing an organic semiconductor pattern, wherein the organic semiconductor pattern is electrically coupled to the Indium Tin Oxide layer and the metal layer; and sequentially manufacturing a gate isolation layer, a gate layer, a passivation layer and a pixel electrode layer.

The metal layer comprises a first metal sub layer and a second metal sub layer located on the first metal sub layer.

Before manufacturing the pixel electrode layer, the method further comprises: forming a via penetrating the passivation layer and the gate isolation layer and connecting with the metal layer with an etching process; the step of manufacturing the pixel electrode layer comprises: manufacturing the pixel electrode layer on the passivation layer, and the pixel electrode layer is electrically coupled to the metal layer and the Indium Tin Oxide layer with the via.

The embodiment of the present invention further provides another pixel structure manufacture method, comprising:

providing a substrate;

forming a gate layer and a gate isolation layer on the substrate;

sequentially forming an Indium Tin Oxide layer and a metal layer on one surface of the gate isolation layer;

coating a photoresist on the metal layer, and implementing exposure, development with a mask to remove all the photoresist in positions corresponding to full light transmission regions of the substrate and the mask, and preserving the photoresist in positions corresponding to full light shield regions of the substrate and the mask, and removing a portion of the photoresist in positions corresponding to halftone regions of the substrate and the mask;

etching the metal layer and the Indium Tin Oxide layer in the positions corresponding to the full light transmission regions of the substrate and the mask by wet etching;

implementing plasma surface treatment to process the substrate to remove the residual photoresist in the positions corresponding to the halftone regions of the substrate and the mask, and removing the portion of the photoresist in the positions corresponding to the full light shield regions of the substrate and the mask;

wet etching the metal layer in the positions corresponding to the halftone regions of the substrate and the mask, and preserving the Indium Tin Oxide layer in the positions corresponding to the full light shield regions, the halftone regions of the substrate and the mask for forming a source, a drain of a thin film transistor on the Indium Tin Oxide layer;

removing the residual photoresist in the positions corresponding to the full light shield regions of the substrate and the mask;

forming an organic semiconductor layer on the substrate and manufacturing an organic semiconductor pattern, wherein the organic semiconductor pattern is electrically coupled to the Indium Tin Oxide layer and the metal layer; and sequentially manufacturing a passivation layer and a pixel electrode layer.

The metal layer comprises a first metal sub layer and a second metal sub layer located on the first metal sub layer.

In the embodiment of the present invention, the source, the drain of the organic thin film transistor are formed on the ITO layer, and the metal layer is located on a portion of the ITO layer. Thus, the contact resistance of the source, the drain and the organic semiconductor layer can be enormously reduced. Moreover, the ITO layer and the metal layer are located to be a data electrode layer of the organic thin film transistor so that the resistance of the data conducting line in the liquid crystal display panel having the pixel structure will not be too large.

Furthermore, in the embodiment of the present invention, merely one mask is employed for manufacturing the pixel structure. The manufacture cost is reduced.

DETAILED DESCRIPTION OF PREFERRED EMBODIMENTS

Figure 1:
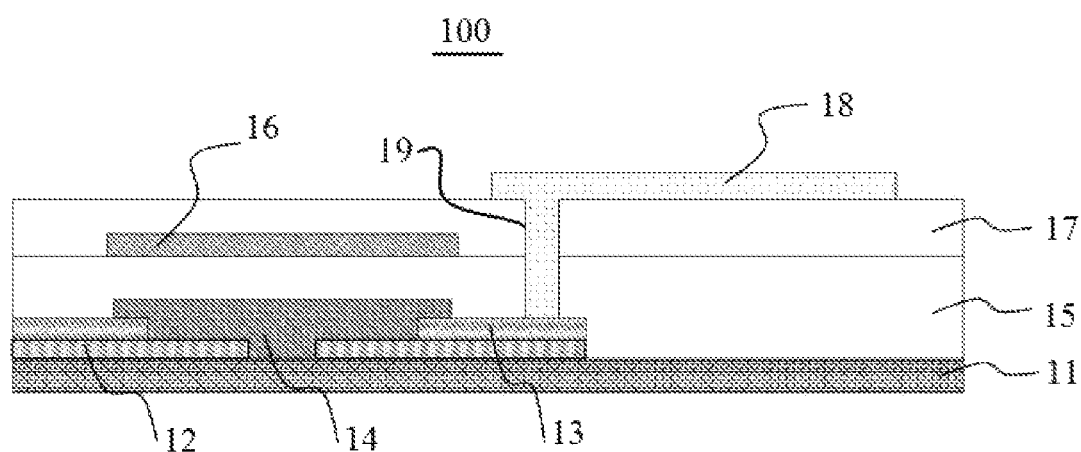
FIG. 1 is a diagram of a top-gate bottom-contact pixel structure in the embodiment of the present invention.

Please refer to FIG. 1. FIG. 1 is a diagram of a top-gate bottom-contact pixel structure 100 in the embodiment of the present invention. The pixel structure 100 comprises a substrate 11, an Indium Tin Oxide (ITO) layer 12, a metal layer 13, an organic semiconductor layer 14, a gate isolation layer 15, a gate layer 16, a passivation layer 17 and a pixel electrode layer 18. The material of the substrate 11 can be glass, poly(ethylene terephthalate) (PEN) or others.

The ITO layer 12 and the metal layer 13 are sequentially located on one surface of the substrate 11, and the metal layer 13 is located on a portion of the ITO layer 12. A source, a drain of an organic thin film transistor are formed on the ITO layer 12. The ITO layer 12 and the metal layer 13 are located to be a data electrode layer of the organic thin film transistor. In this embodiment, the metal layer 13 comprises a first metal sub layer and a second metal sub layer located on the first metal sub layer. The material of the first metal sub layer is the metal of which the resistivity is lower, such as aluminum (Al), chromium (Cr), copper (Cu), and the material of the second metal sub layer is the metal which is hardly to be oxidized, such as molybdenum (Mu), tungsten (W). In other embodiment, the metal layer 13 also can comprise merely one metal layer, and the material is the metal which has lower resistivity and is hardly to be oxidized, such as silver (Ag), aluminum (Al). In the embodiment, the source, the drain are formed on the ITO layer 12, and the metal layer 13 is located on a portion of the ITO layer 12. Thus, the contact resistance of the source, the drain and the organic semiconductor layer 14 can be enormously reduced. Moreover, the ITO layer 12 and the metal layer 13 are located to be a data electrode layer of the organic thin film transistor so that the resistance of the data conducting line in the liquid crystal display panel having the pixel structure 100 will not be too large.

In this embodiment, a pattern formed at the organic semiconductor layer 14 is electrically coupled to the ITO layer 12 and the metal layer 13. The gate layer 16 is located on the gate isolation layer 15. The passivation layer 17 is located on the gate isolation layer 15. The pixel structure 100 further comprises a via 19 penetrating the passivation layer 17 and the gate isolation layer 15 and connecting with the metal layer 13. The pixel electrode layer 18 is located on the passivation layer 17, and is electrically coupled to the metal layer 13 and the ITO layer 12 with the via 19.

Figure 2:
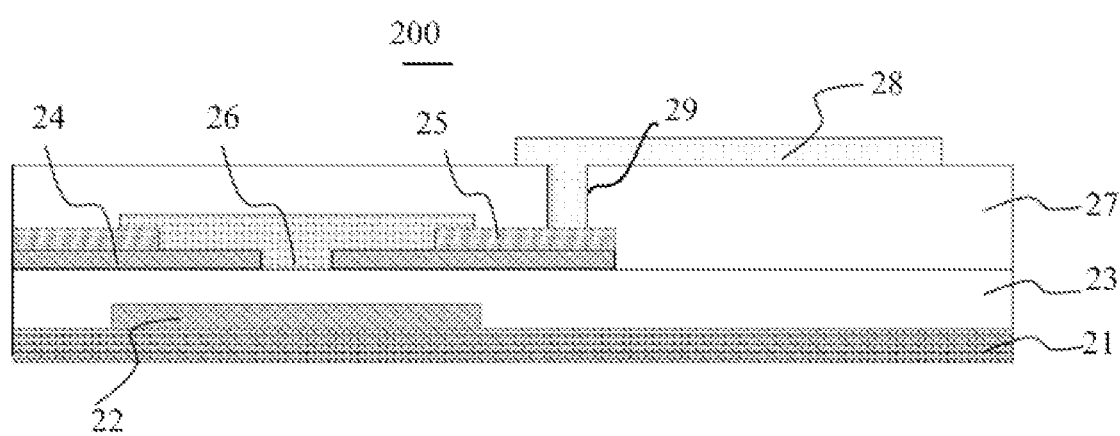
FIG. 2 is a diagram of a bottom-gate bottom-contact pixel structure in the embodiment of the present invention.

Please refer to FIG. 2. FIG. 2 is a diagram of a bottom-gate bottom-contact pixel structure 200 in the embodiment of the present invention. The pixel structure 200 comprises a substrate 21, a gate layer 22, a gate isolation layer 23, an ITO layer 24, a metal layer 25, an organic semiconductor layer 26, a passivation layer 27 and a pixel electrode layer 28. The material of the substrate 21 can be glass, poly (ethylene terephthalate) (PEN) or others.

The gate layer 22 and the gate isolation layer 23 are located on one surface of the substrate 21. The ITO layer 24 and the metal layer 25 are sequentially located on the gate isolation layer 23, and the metal layer 25 is located on a portion of the ITO layer 24. A source, a drain of an organic thin film transistor are formed on the ITO layer 24. The ITO layer 24 and the metal layer 25 are located to be a data electrode layer of the organic thin film transistor. In this embodiment, the metal layer 25 comprises a first metal sub layer and a second metal sub layer located on the first metal sub layer. The material of the first metal sub layer is the metal of which the resistivity is lower, such as aluminum (Al), chromium (Cr), copper (Cu), and the material of the second metal sub layer is the metal which is hardly to be oxidized, such as molybdenum (Mu), tungsten (W). In other embodiment, the metal layer 25 also can comprise merely one metal layer, and the material is the metal which has lower resistivity and is hardly to be oxidized, such as silver (Ag), aluminum (Al). In the embodiment, the source, the drain are formed on the ITO layer 24, and the metal layer 25 is located on a portion of the ITO layer 24. Thus, the contact resistance of the source, the drain and the organic semiconductor layer 26 can be enormously reduced. Moreover, the ITO layer 24 and the metal layer 25 are located to be a data electrode layer of the organic thin film transistor so that the resistance of the data conducting line in the liquid crystal display panel having the pixel structure 200 will not be too large.

In this embodiment, a pattern formed at the organic semiconductor layer 26 is electrically coupled to the ITO layer 24 and the metal layer 25. The passivation layer 27 is located on the gate isolation layer 23. The pixel structure 200 further comprises a via 29 formed in the passivation layer 27 and connecting with the metal layer 25. The pixel electrode layer 28 is located on the passivation layer 27, and is electrically coupled to the metal layer 25 and the ITO layer 24 with the via 29.

Figure 3:
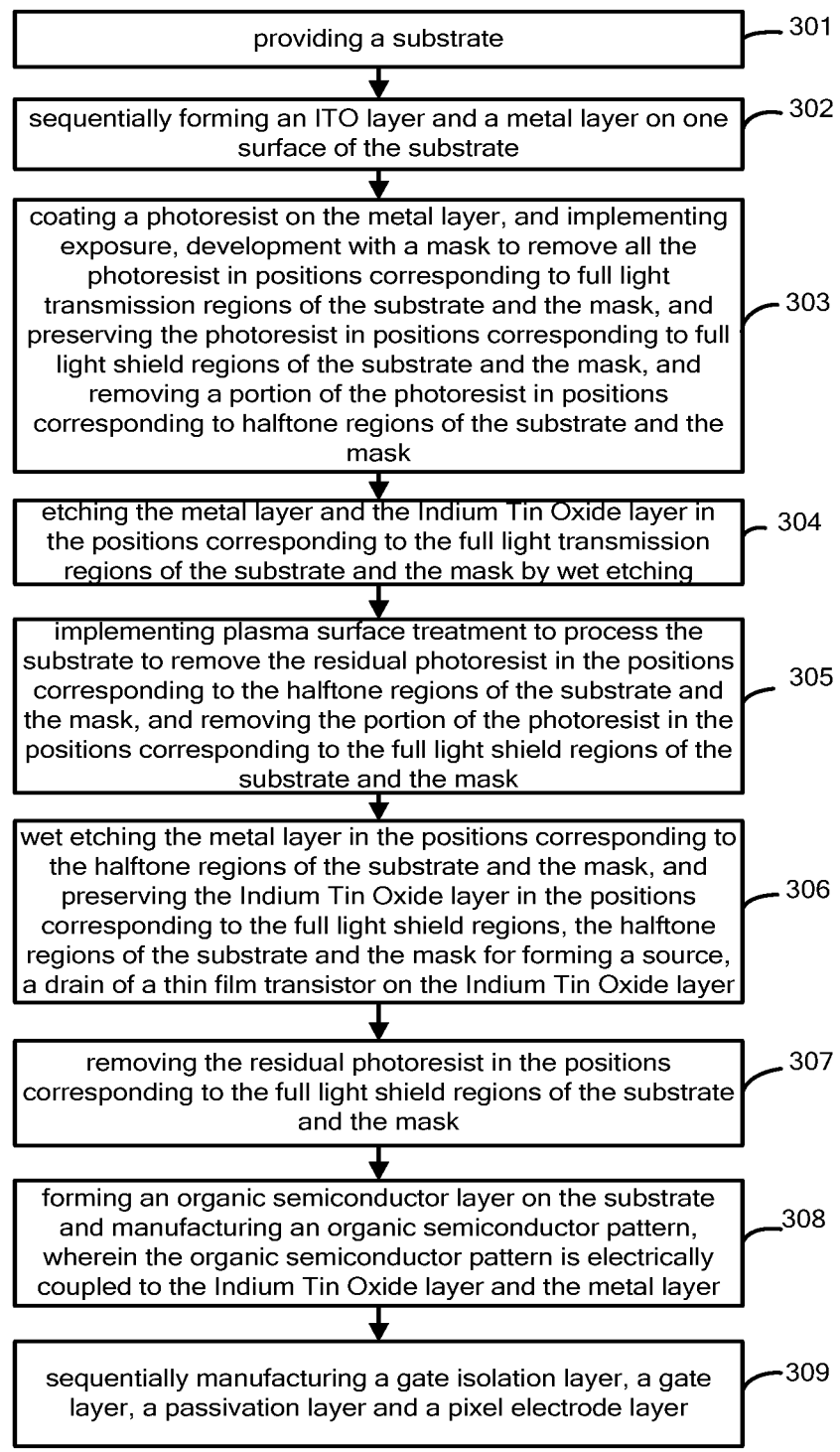
FIG. 3 is a flowchart of a manufacture method of a top-gate bottom-contact pixel structure in the embodiment of the present invention.

Please refer to FIG. 3. FIG. 3 is a flowchart of a manufacture method of a top-gate bottom-contact pixel structure 100 in the embodiment of the present invention.

step 301, providing a substrate 11.

The material of the substrate 11 can be glass, poly (ethylene terephthalate) (PEN) or others.

step 302, sequentially forming an ITO layer 12 and a metal layer 13 on one surface of the substrate 11.

The ITO layer 12 and the metal layer 13 are deposed on the substrate 11 by utilizing the Physic Vapor Deposition (PVD) film formation method according to the traditional process. The repeated description is omitted here.

Figure 5:
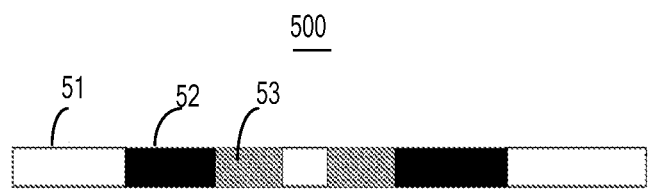
FIG. 5 is a structure diagram of a mask in the embodiment of the present invention.

Two metal sub layers can be formed on the ITO layer 12. The material of the metal sub layer contacting with the ITO layer 12 is the metal of which the resistivity is lower, such as aluminum (Al), chromium (Cr), copper (Cu), and the material of the other metal sub layer is the metal which is hardly to be oxidized, such as molybdenum (Mu), tungsten (W). In other embodiment, merely one metal layer can be deposed on the ITO layer 12, and the material of the metal layer 13 is the metal which has lower resistivity and is hardly to be oxidized, such as silver (Ag), aluminum (Al).

step 303, coating a photoresist on the metal layer 13, and implementing exposure, development with a mask 500 (as shown in FIG. 5) to remove all the photoresist in positions corresponding to full light transmission regions 51 of the substrate 11 and the mask 500, and preserving the photoresist in positions corresponding to full light shield regions 52 of the substrate 11 and the mask 500, and removing a portion of the photoresist in positions corresponding to halftone regions 53 of the substrate 11 and the mask 500.

The method of implementing exposure, development with the mask 500 is prior art. The repeated description is omitted here. The mask 500 can be a halftone mask or a gray scale mask.

step 304, etching the metal layer 13 and the ITO layer 12 in the positions corresponding to the full light transmission regions 51 of the substrate 11 and the mask 500 by wet etching.

step 305, implementing plasma surface treatment to process the substrate 11 to remove the residual photoresist in the positions corresponding to the halftone regions 53 of the substrate 11 and the mask 500, and removing the portion of the photoresist in the positions corresponding to the full light shield regions 52 of the substrate 11 and the mask 500.

step 306, wet etching the metal layer 13 in the positions corresponding to the halftone regions 53 of the substrate 11 and the mask 500, and preserving the ITO layer 12 in the positions corresponding to the full light shield regions 52, the halftone regions 53 of the substrate 11 and the mask 500 for forming a source, a drain of a thin film transistor on the ITO layer 12. After this step, the metal layer 13 is located on a portion of the ITO layer 12.

step 307, removing the residual photoresist in the positions corresponding to the full light shield regions 52 of the substrate 11 and the mask 500.

step 308, forming an organic semiconductor layer 14 on the substrate 11 and manufacturing an organic semiconductor pattern, wherein the organic semiconductor pattern is electrically coupled to the ITO layer 12 and the metal layer 13.

The traditional exposure, development, etching processes are employed to manufacture the organic semiconductor pattern. The repeated description is omitted here.

step 309, sequentially manufacturing a gate isolation layer 15, a gate layer 16, a passivation layer 17 and a pixel electrode layer 18.

The traditional manufacture process of the organic thin film transistor is employed to manufacture the gate isolation layer 15, the gate layer 16, the passivation layer 17 and the pixel electrode layer 18. The repeated description is omitted here.

Before manufacturing the pixel electrode layer 18, the method further comprises: forming a via 19 penetrating the passivation layer 17 and the gate isolation layer 15 and connecting with the metal layer 13 with an etching process. The step of manufacturing the pixel electrode layer 18 comprises: manufacturing the pixel electrode layer 18 on the passivation layer 17, and the pixel electrode layer 18 is electrically coupled to the metal layer 13 and the ITO layer 12 with the via 19.

In the embodiment, the source, the drain are formed on the ITO layer 12, and the metal layer 13 is located on a portion of the ITO layer 12. Thus, the contact resistance of the source, the drain and the organic semiconductor layer 14 can be enormously reduced. Moreover, the ITO layer 12 and the metal layer 13 are located to be a data electrode layer of the organic thin film transistor so that the resistance of the data conducting line in the liquid crystal display panel having the pixel structure 100 will not be too large. Furthermore, in the embodiment of the present invention, merely one mask 500 is employed for manufacturing the pixel structure. The manufacture cost is reduced.

Figure 4:
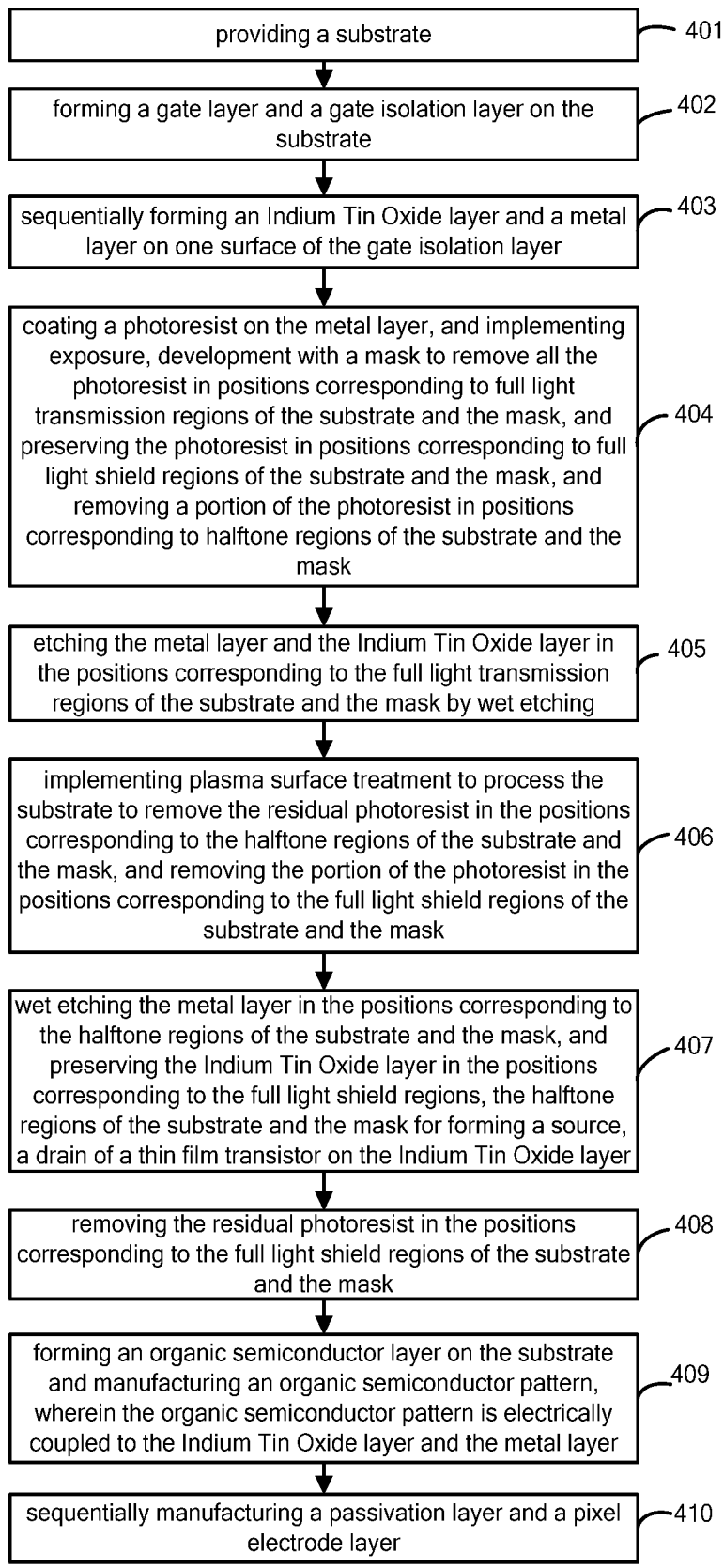
FIG. 4 is a flowchart of a manufacture method of a bottom-gate bottom-contact pixel structure in the embodiment of the present invention.

Please refer to FIG. 4. FIG. 4 is a flowchart of a manufacture method of a bottom-gate bottom-contact pixel structure 200 in the embodiment of the present invention.

step 401, providing a substrate 21.

The material of the substrate 21 can be glass, poly (ethylene terephthalate) (PEN) or others.

step 402, sequentially forming the gate layer 22 and the gate isolation layer 23 on one surface of the substrate 21.

The traditional manufacture process of the organic thin film transistor is employed to manufacture the gate layer 22 and the gate isolation layer 23. The repeated description is omitted here.

step 403, sequentially forming an ITO layer 24 and a metal layer 25 on one surface of the gate isolation layer 23.

The ITO layer 24 and the metal layer 25 are deposed on the substrate 21 by utilizing the Physic Vapor Deposition (PVD) film formation method according to the traditional process. The repeated description is omitted here.

Two metal sub layers can be formed on the ITO layer 24. The material of the metal sub layer contacting with the ITO layer 24 is the metal of which the resistivity is lower, such as aluminum (Al), chromium (Cr), copper (Cu), and the material of the other metal sub layer is the metal which is hardly to be oxidized, such as molybdenum (Mu), tungsten (W). In other embodiment, merely one metal layer can be deposed on the ITO layer 24, and the material of the metal layer 25 is the metal which has lower resistivity and is hardly to be oxidized, such as silver (Ag), aluminum (Al).

step 404, coating a photoresist on the metal layer 25, and implementing exposure, development with a mask 500 (as shown in FIG. 5) to remove all the photoresist in positions corresponding to full light transmission regions 51 of the substrate 21 and the mask 500, and preserving the photoresist in positions corresponding to full light shield regions 52 of the substrate 21 and the mask 500, and removing a portion of the photoresist in positions corresponding to halftone regions 53 of the substrate 21 and the mask 500.

The method of implementing exposure, development with the mask 500 is prior art. The repeated description is omitted here. The mask 500 can be a halftone mask or a gray scale mask.

step 405, etching the metal layer 25 and the ITO layer 24 in the positions corresponding to the full light transmission regions 51 of the substrate 21 and the mask 500 by wet etching.

step 406, implementing plasma surface treatment to process the substrate 21 to remove the residual photoresist in the positions corresponding to the halftone regions 53 of the substrate 21 and the mask 500, and removing the portion of the photoresist in the positions corresponding to the full light shield regions 52 of the substrate 21 and the mask 500.

step 407, wet etching the metal layer 25 in the positions corresponding to the halftone regions 53 of the substrate 21 and the mask 500, and preserving the ITO layer 24 in the positions corresponding to the full light shield regions 52, the halftone regions 53 of the substrate 21 and the mask for forming a source, a drain of a thin film transistor on the ITO layer 24. After this step, the metal layer 25 is located on a portion of the ITO layer 24.

step 408, removing the residual photoresist in the positions corresponding to the full light shield regions 52 of the substrate 21 and the mask 500.

step 409, forming an organic semiconductor layer 26 on the substrate 21 and manufacturing an organic semiconductor pattern, wherein the organic semiconductor pattern is electrically coupled to the ITO layer 24 and the metal layer 25.

The traditional exposure, development, etching processes to manufacture the organic semiconductor pattern. The repeated description is omitted here.

step 410, sequentially manufacturing a passivation layer 27 and a pixel electrode layer 28.

The traditional manufacture process of the organic thin film transistor is employed to manufacture the passivation layer 27 and the pixel electrode layer 28. The repeated description is omitted here.

Before manufacturing the pixel electrode layer 28, the method further comprises: forming a via 29 penetrating the passivation layer 27 and connecting with the metal layer 25 with an etching process. The step of manufacturing the pixel electrode layer 28 comprises: manufacturing the pixel electrode layer 28 on the passivation layer 27, and the pixel electrode layer 28 is electrically coupled to the metal layer 25 and the ITO layer 24 with the via 29.

In the embodiment, the source, the drain are formed on the ITO layer 24, and the metal layer 25 is located on a portion of the ITO layer 24. Thus, the contact resistance of the source, the drain and the organic semiconductor layer 26 can be enormously reduced. Moreover, the ITO layer 24 and the metal layer 25 are located to be a data electrode layer of the organic thin film transistor so that the resistance of the data conducting line in the liquid crystal display panel having the pixel structure 200 will not be too large. Furthermore, in the embodiment of the present invention, merely one mask 500 is employed for manufacturing the pixel structure. The manufacture cost is reduced.

Figure 6:
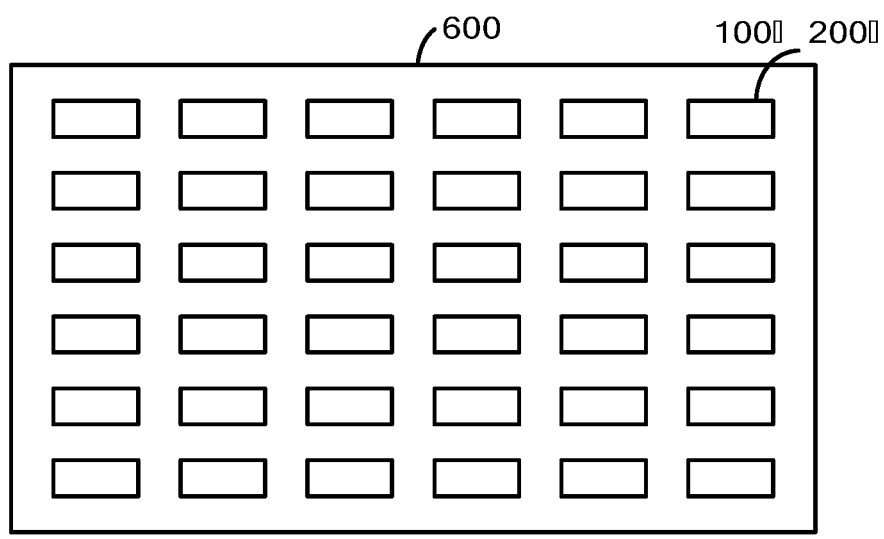
FIG. 6 is a structure diagram of an array substrate in the embodiment of the present invention.

Please refer to FIG. 6. The array substrate 600 in the embodiment of the present invention comprises a plurality of pixel structures 100 or 200 which are distributed in an array.

Figure 7:
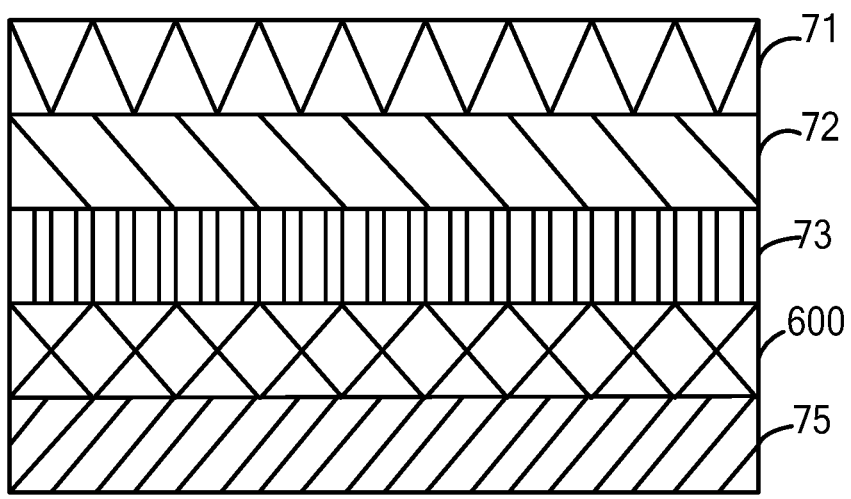
FIG. 7 is a structure diagram of a liquid crystal display panel in the embodiment of the present invention.

Please refer to FIG. 7. The liquid crystal display panel in the embodiment of the present invention comprises an upper polarizer 71, a color filter 72, a liquid crystal layer 73, an array substrate 600 and a lower polarizer 75. The array substrate 600 is the array substrate 600 shown in FIG. 6.

What is claimed is:

1. A pixel structure, comprising a pixel electrode layer and a thin film transistor, and the thin film transistor comprises a gate, a source and a drain which are isolated with the gate and an organic semiconductor layer, wherein the pixel structure further comprises an Indium Tin Oxide layer and a metal layer, and the metal layer is located on a portion of the Indium Tin Oxide layer, and the source, the drain are formed on the Indium Tin Oxide layer, and a pattern formed by the organic semiconductor layer is electrically coupled to the Indium Tin Oxide layer and the metal layer, and the pixel electrode layer is electrically coupled to the metal layer and the Indium Tin Oxide layer;

wherein the metal layer is located on a first portion of a surface of the Indium Tin Oxide layer to expose a second portion of the surface of the Indium Tin Oxide layer, and the pattern of the organic semiconductor is partly located on the second portion of the Indium Tin Oxide layer and a surface of the metal layer that is opposite to the Indium Tin Oxide layer such that the pattern of the organic semiconductor layer is in direct contact with and thus electrically connected to both the metal layer and the Indium Tin Oxide layer;

wherein the pixel electrode layer is spaced from the thin film transistor and the metal layer is arranged between the pixel electrode layer and the Indium Tin Oxide layer such that the pixel electrode layer is directly connected to the metal layer and is spaced from the Indium Tin Oxide layer by the metal layer; and wherein the Indium Tin Oxide layer comprises two separate parts each of which comprise the first portion and the second portion, the two separate parts of the Indium Tin Oxide layer being respectively formed of the source and the drain, which are opposite to and spaced from each other by an intermediate spacing distance, wherein the second portions of the two parts of the Indium Tin Oxide are located adjacent to and the first portions of the parts of the Indium Tin Oxide are located distant from each other.

2. The pixel structure according to claim 1, wherein the pixel electrode layer is electrically coupled to the metal layer and the Indium Tin Oxide layer with a via.

3. The pixel structure according to claim 1, wherein the metal layer comprises a first metal sub layer and a second metal sub layer located on the first metal sub layer.

* * * * *